(12) United States Patent
Bradley et al.

(10) Patent No.: US 9,154,111 B2
(45) Date of Patent: Oct. 6, 2015

(54) DOUBLE BULK ACOUSTIC RESONATOR COMPRISING ALUMINUM SCANDIUM NITRIDE

(71) Applicant: Avago Technologies General IP (Singapore) Pte. Ltd., Singapore (SG)

(72) Inventors: Paul Bradley, Los Altos, CA (US); Alexandre Shirakawa, San Jose, CA (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 274 days.

(21) Appl. No.: 13/778,593

(22) Filed: Feb. 27, 2013

(65) Prior Publication Data

US 2013/0176086 A1    Jul. 11, 2013

Related U.S. Application Data

(63) Continuation-in-part of application No. 13/112,407, filed on May 20, 2011, now abandoned.

(51) Int. Cl.
| | |
|---|---|
| *H03H 9/00* | (2006.01) |
| *H03H 9/54* | (2006.01) |
| *H03H 9/10* | (2006.01) |
| *H03H 9/17* | (2006.01) |
| *H03H 9/58* | (2006.01) |
| *H03H 9/02* | (2006.01) |

(52) U.S. Cl.
CPC .............. *H03H 9/54* (2013.01); *H03H 9/1007* (2013.01); *H03H 9/1014* (2013.01); *H03H 9/173* (2013.01); *H03H 9/175* (2013.01); *H03H 9/585* (2013.01); *H03H 9/0211* (2013.01)

(58) Field of Classification Search
None
See application file for complete search history.

(56) References Cited

U.S. PATENT DOCUMENTS

| | | | |
|---|---|---|---|
| 5,587,620 A | 12/1996 | Ruby et al. | |
| 5,872,493 A * | 2/1999 | Ella | 333/191 |
| 5,873,153 A | 2/1999 | Ruby et al. | |
| 6,060,818 A | 5/2000 | Ruby et al. | |
| 6,107,721 A | 8/2000 | Lakin | |
| 6,384,697 B1 | 5/2002 | Ruby | |
| 6,466,105 B1 | 10/2002 | Lobl et al. | |
| 6,507,983 B1 | 1/2003 | Ruby et al. | |

(Continued)

FOREIGN PATENT DOCUMENTS

| | | |
|---|---|---|
| DE | 10150253 | 4/2003 |
| DE | 102006032950 | 1/2008 |

OTHER PUBLICATIONS

Akiyama, et al., "Enhancement of Piezoelectric Response in Scandium Aluminum Nitride Alloy Thin Films Prepared by Dual Reactive Cosputtering", *Adv. Mater* 2009, 593-596.

(Continued)

*Primary Examiner* — Lincoln Donovan
*Assistant Examiner* — Khareem E Almo

(57) ABSTRACT

A method of forming a double bulk acoustic resonator structure comprises forming a first electrode on a substrate, forming a first piezoelectric layer on the first electrode, forming a second electrode on the first piezoelectric layer, forming a second piezoelectric layer on the second electrode, and forming a third electrode on the second piezoelectric layer. The first and second piezoelectric layers are formed by a sputter deposition process using at least one sputter target comprising a combination of scandium and aluminum.

23 Claims, 6 Drawing Sheets

(56) References Cited

U.S. PATENT DOCUMENTS

| | | | |
|---|---|---|---|
| 6,583,688 B2 | 6/2003 | Klee et al. | |
| 6,936,837 B2 | 8/2005 | Yamada et al. | |
| 7,280,007 B2 | 10/2007 | Feng et al. | |
| 7,345,410 B2 | 3/2008 | Grannen et al. | |
| 7,358,831 B2 | 4/2008 | Larson et al. | |
| 7,388,454 B2 | 6/2008 | Ruby et al. | |
| 7,463,118 B2 | 12/2008 | Jacobsen | |
| 7,466,213 B2 | 12/2008 | Lobl et al. | |
| 7,561,009 B2 | 7/2009 | Larson, III et al. | |
| 7,629,865 B2 | 12/2009 | Ruby | |
| 7,684,109 B2 | 3/2010 | Godshalk et al. | |
| 7,758,979 B2 * | 7/2010 | Akiyama et al. | 428/699 |
| 7,889,024 B2 | 2/2011 | Bradley et al. | |
| 8,248,185 B2 | 8/2012 | Choy et al. | |
| 8,330,325 B1 * | 12/2012 | Burak et al. | 310/320 |
| 8,902,023 B2 * | 12/2014 | Choy et al. | 333/187 |
| 8,922,302 B2 * | 12/2014 | Ruby | 333/187 |
| 2005/0057117 A1 | 3/2005 | Nakatsuka et al. | |
| 2005/0168104 A1 | 8/2005 | Bouche et al. | |
| 2006/0164186 A1 | 7/2006 | Stoemmer et al. | |
| 2006/0202779 A1 | 9/2006 | Fazzio et al. | |
| 2007/0024395 A1 | 2/2007 | Motai | |
| 2007/0085632 A1 | 4/2007 | Larson, III et al. | |
| 2007/0205850 A1 | 9/2007 | Jamneala et al. | |
| 2007/0278469 A1 | 12/2007 | Marty et al. | |
| 2007/0279149 A1 | 12/2007 | Dal Molin | |
| 2008/0055020 A1 | 3/2008 | Handtmann et al. | |
| 2008/0079516 A1 | 4/2008 | Ruby et al. | |
| 2008/0169884 A1 | 7/2008 | Matsumoto et al. | |
| 2008/0204857 A1 | 8/2008 | Godshalk et al. | |
| 2008/0297278 A1 | 12/2008 | Handtmann et al. | |
| 2010/0052815 A1 | 3/2010 | Bradley et al. | |
| 2010/0327697 A1 | 12/2010 | Choy et al. | |
| 2010/0327994 A1 | 12/2010 | Choy et al. | |
| 2012/0050236 A1 | 3/2012 | Lo et al. | |
| 2012/0104900 A1 | 5/2012 | Nishihara et al. | |
| 2012/0107557 A1 | 5/2012 | Akiyama et al. | |
| 2012/0218055 A1 * | 8/2012 | Burak et al. | 333/187 |
| 2012/0218056 A1 | 8/2012 | Burak et al. | |
| 2012/0218059 A1 * | 8/2012 | Burak et al. | 333/191 |
| 2012/0218060 A1 * | 8/2012 | Burak et al. | 333/191 |
| 2012/0248941 A1 | 10/2012 | Shirakawa et al. | |
| 2012/0280767 A1 | 11/2012 | Burak et al. | |
| 2012/0293278 A1 * | 11/2012 | Burak et al. | 333/189 |
| 2013/0038408 A1 * | 2/2013 | Burak et al. | 333/187 |
| 2013/0063226 A1 * | 3/2013 | Burak et al. | 333/187 |
| 2013/0106534 A1 * | 5/2013 | Burak et al. | 333/187 |
| 2013/0176086 A1 * | 7/2013 | Bradley et al. | 333/189 |
| 2014/0118089 A1 * | 5/2014 | Bradley et al. | 333/187 |
| 2014/0118090 A1 * | 5/2014 | Grannen et al. | 333/187 |
| 2014/0125202 A1 * | 5/2014 | Choy et al. | 310/365 |
| 2014/0125203 A1 * | 5/2014 | Choy et al. | 310/365 |
| 2014/0174908 A1 * | 6/2014 | Feng et al. | 204/192.1 |
| 2014/0340172 A1 * | 11/2014 | Bradley et al. | 333/187 |
| 2014/0354109 A1 * | 12/2014 | Grannen et al. | 310/311 |

OTHER PUBLICATIONS

Suzuki, et al., "Influence of shadowing effect on shear mode acoustic properties in the c-axis tilted AlN films", *IEEE International Ultrasonics Symposium* 2010.

Yanagitani, et al., "Giant Shear Mode Electromechanical Coupling Coefficient k15 in C-Axis Tilted ScAlN Films", *IEEE International Ultrasonics Symposium* 2010.

Moreira, et al. "Aluminum scandium nitride thin-film bulk acoustic resonators for wide band applications", Vacuum 86 (2011) 23-26.

Ranjan et al. "Strained Hexagonal ScN: A Material with Unusual Structural and Optical Properties," Physical Review Letters, Jun. 27, 2003, vol. 90, No. 25, The American Physical Society, USA.

Farrer et al., "Properties of hexagonal ScN versus wurtzite GaN and InN," Physical Review B, Nov. 20, 2002, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

* cited by examiner

DOUBLE BULK ACOUSTIC RESONATOR COMPRISING ALUMINUM SCANDIUM NITRIDE

CROSS-REFERENCE TO RELATED APPLICATIONS

This application is a continuation-in-part of U.S. patent application Ser. No. 13/112,407 filed May 20, 2011, the subject matter of which is hereby incorporated by reference.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), double bulk acoustic resonators (DBARs), and solidly mounted resonators (SMRs), to name but a few.

FIG. 1 is a block diagram illustrating an example of a band pass filter 100 formed by a plurality of acoustic resonators. Band pass filter 100 has a ladder circuit configuration that can be found, for instance in duplexer circuits associated with transmitters and receivers of mobile telephones.

Referring to FIG. 1, band pass filter 100 comprises a plurality of series resonators 105 and a plurality of shunt resonators 110 connected between an input port and an output port. Series resonators 105 have higher resonant frequencies than shunt resonators 110. Accordingly, they allow higher frequencies to pass through while shunting out lower frequencies.

FIG. 2 is a cross-sectional view illustrating an acoustic resonator 200 that can be included as one of series resonators 105 or shunt resonators 110 in the example of FIG. 1. In this example, acoustic resonator 200 is an FBAR.

Referring to FIG. 2, acoustic resonator 200 comprises a substrate 205 and an acoustic stack 210 formed on substrate 205. Acoustic stack 210 comprises a piezoelectric layer 220 disposed between a first electrode 215 and a second electrode 225. Piezoelectric layer 220 comprises a piezoelectric material that converts electrical energy into mechanical movement and vice versa.

During typical operation, an electrical bias applied between first electrode 215 and second electrode 225 causes piezoelectric layer 220 to expand (or contract, depending on a phase of electrical signal) through the inverse piezoelectric effect. The expansion (or contraction) of piezoelectric layer 220 produces electric charge through the direct piezoelectric effect, which is then presented to the electrodes. Where the frequency of the electrical signal and the natural mechanical resonance frequency of acoustic stack 210 are close to each other, an electromechanical resonant state occurs resulting in significant mechanical displacements of particles comprising acoustic stack 210 and significant modification of electrical signal at electrodes 215 and 225. This electrical response is a basis of signal filtering in band pass filter 100 of FIG. 1. Where the frequency of the electrical signal is far away from mechanical resonance frequency of the stack 210, the mechanical displacement of particles is negligible and so is the produced charge, thus resulting in a standard capacitor-like electrical response of the resonator 200.

An air cavity 230 is formed in substrate 205 to facilitate mechanical movement of acoustic stack 210. Air cavity 230 facilitates mechanical movement by creating acoustic isolation between acoustic stack 210 and substrate 205. This acoustic isolation prevents acoustic stack 210 from losing mechanical energy to substrate 230, which in turn prevents acoustic stack 210 from losing signal strength.

A microcap 235 is connected to acoustic stack 210 using wafer bonding technology. Microcap 235 can be formed, for instance, by etching a cavity in a silicon wafer and placing the cavity over acoustic stack 210. It can also be formed, for instance, by attaching an annular gasket to substrate 205 and placing silicon over the annular gasket. Microcap 235 forms an air cavity 245 over acoustic stack 210 and allows for unobstructed movement of acoustic stack 210. It also hermetically seals acoustic resonator 200 to prevent damage from environmental factors such as humidity.

In addition to the features shown in FIG. 2, acoustic resonator 200 typically comprises electrical contact pads connected to first and second electrodes 215 and 225. The electrical contact pads extend outward from the sides of acoustic resonator 200 to transmit input and output signals to first and second electrodes 215 and 225, respectively.

Significant design considerations for acoustic resonators include, among other things, cost, chip area, and response characteristics. There are various factors that affect each of these considerations. For instance, the cost of a resonator typically varies according to the materials and processes used in its manufacture. The chip area, meanwhile, tends to vary according to the lateral width of the acoustic stack and associated components, such as the microcap and contact pads. In general, the lateral width of the acoustic stack varies according to its passband, with lower frequency resonators occupying more space than higher frequency resonators. The response characteristics of an acoustic resonator are defined by various parameters, such as an electromechanical coupling coefficient ($k_t^2$) and a quality (Q) factor. The electromechanical coupling coefficient $k_t^2$ indicates the efficiency of energy transfer between electrodes and the piezoelectric materials. This coefficient influences insertion loss and bandwidth of the fitter 100. The Q factor affects roll-off of the filter 100, and it varies according to various material properties of the acoustic resonator 200, such as a series resistance Rs and a parallel resistance Rp, which correspond to various heat tosses and acoustic losses of the resonator 200.

When designing an acoustic resonator using conventional approaches, there are generally tradeoffs to be made between the above design considerations. For example, the use of a stacked resonator design such as a DBAR, rather than an FBAR, may reduce cost, chip area, and cancel undesirable second order non-linearities, but it generally compromises other aspects of performance, such as the electromechanical coupling coefficient $k_t^2$ and the Q factor. Accordingly, in view of these and other tradeoffs, there is a general need for techniques and technologies that can be used to improve one or more of the above design considerations without negatively impacting the others.

SUMMARY

In a representative embodiment, a method of forming a DBAR structure comprises forming a first electrode on a substrate, forming a first piezoelectric layer on the first electrode, forming a second electrode on the first piezoelectric layer, forming a second piezoelectric layer on the second electrode, and forming a third electrode on the second piezoelectric layer. The first and second piezoelectric layers are formed by a sputter deposition process using at least one sputter target comprising a combination of scandium and aluminum. The top and bottom electrodes are typically shorted together to produce a two terminal device with an electrical response that looks like an FBAR with second order mixing products cancelled and the $k_t^2$ and Q factor are usually somewhat degraded.

In another representative embodiment a DBAR structure comprises a first electrode on a substrate, a first piezoelectric layer on the first electrode and comprising aluminum scandium nitride, a second electrode on the first piezoelectric layer, a second piezoelectric layer on the second electrode and comprising aluminum scandium nitride, and a third electrode on the second piezoelectric layer.

In another representative embodiment, a ladder filter comprises a plurality of series resonators and a plurality of shunt resonators connected between an input port and an output port. At least one of the series or shunt resonators comprises a DBAR, comprising a first electrode on a substrate, a first piezoelectric layer on the first electrode and comprising aluminum scandium nitride, a second electrode on the first piezoelectric layer, a second piezoelectric layer on the second electrode and comprising aluminum scandium nitride, and a third electrode on the second piezoelectric layer.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
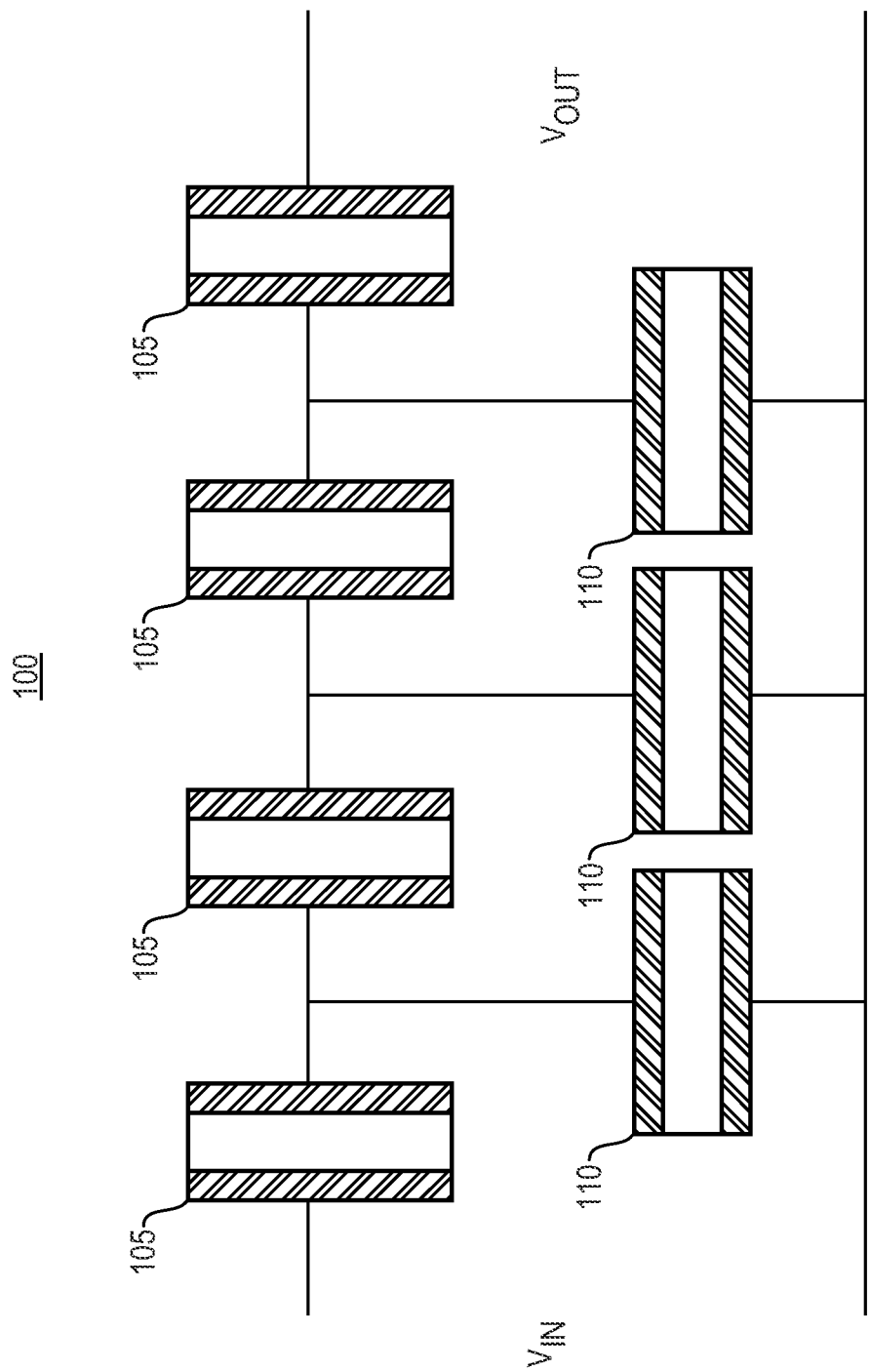
FIG. 1 is a block diagram illustrating a conventional bandpass filter comprising a plurality of acoustic resonators.
Figure 2:
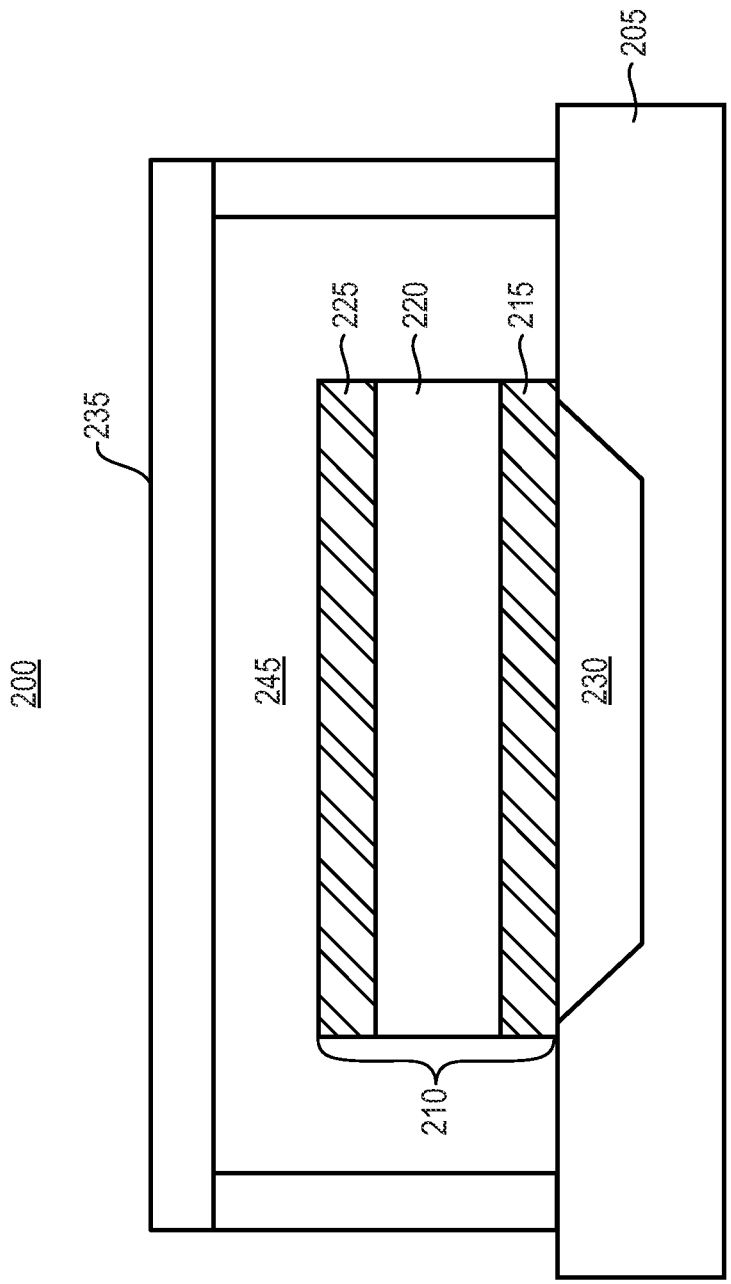
FIG. 2 is a cross-sectional view illustrating a conventional acoustic resonator.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The drawings and the various elements depicted therein are not drawn to scale. In addition, relative terms, such as "above," "below," "top," "bottom," "upper" and "tower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator structures comprising DBARs. In certain applications, the HAW resonator structures provide DBAR-based filters (e.g., ladder filters). Certain details of DBARs, BAW resonator filters, materials thereof and their methods of fabrication may be found in one or more of the following commonly owned U.S. patents and Patent Applications: U.S. Pat. No. 6,107,721, to Lakin; U.S. Pat. Nos. 5,587,620, 5,873,153, 6,507,983 and 7,629,865 to Ruby, et al.; U.S. Pat. No. 7,280,007 to Feng, et al.; U.S. Patent Application Publication No. 2007/0205850 to Jamneala, et al.; U.S. Pat. No. 7,388,454 to Ruby, et al; U.S. Pat. No. 8,248,085 to Choy, et al.; and U.S. Patent Application Publication No. 2010/0327994 to Choy, et al. Examples of stacked bulk acoustic resonators, as well as their materials and methods of fabrication, may be found in U.S. Pat. No. 7,889,024 to Paul Bradley et al., U.S. Patent Application Publication No. 2012/0248941 to Shirakawa et at, and U.S. Patent Application Publications Nos. 2012/0218056, 2012/0280767, and 2012/0293278 to Burak et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

In certain embodiments described below, a DBAR comprises a bottom electrode formed on a substrate, a bottom piezoelectric layer formed on the bottom electrode, a middle electrode formed on the bottom piezoelectric layer, a top piezoelectric layer formed on the middle electrode, and a top electrode formed on the top piezoelectric layer. At least one of the bottom and top piezoelectric layers comprises a thin film of aluminum scandium nitride ($Al_{1-x}Sc_xN$; $0<x<1$). The thin film is typically formed by a sputtering process using one or more scandium doped aluminum sputter targets in an atmosphere comprising at least nitrogen gas. In some embodiments, fir instance, the targets may comprise 5 to 10 percent scandium atoms ($0.05 \leq x \leq 0.10$), leaving 90 to 95 percent aluminum atoms. Accordingly, the resulting thin film is similar to aluminum nitride (AlN), except that about 5 to 10 percent of the aluminum atoms are replaced with scandium. Alternatively, a higher or lower concentration of scandium atoms could also be used in the sputter target to achieve a corresponding increase or decrease in the scandium concentration of the thin film.

In general, a DBAR can provide a cost improvement relative to an FBAR by reducing the resonator area by a factor of two. In addition, it can also reduce second-order nonlinearities, by approximately 30 dB, which tends to improve performance. This reduction of second-order nonlinearities occurs because second-order vibrations in top and bottom halves of the DBAR are 180 degrees out of phase and tend to cancel each other during typical operation. Unfortunately, however, a typical DBAR may have approximately 5 percent lower piezoelectric coupling coefficient compared to an FBAR, and approximately 33 percent smaller Q factor. Consequently, it tends to have greater insertion loss and smaller bandwidth, which can produce inadequate performance for a duplexer circuit or other application. One reason for the deterioration in insertion loss and Q factor is that a DBAR having half the resonator area of an FBAR tends to have a larger perimeter-to-area ratio, which allows the DBAR to lose more energy than the FBAR. In particular, when stacking two halves of a DBAR on top of each other, the perimeter-to-area ratio of the DBAR is larger than the FBAR by the square root of two, but its height is double that of the FBAR, so the overall edge area (perimeter times height) of the DBAR is greater than that of the same impedance FBAR by approximately the square root of two.

Another factor that may limit the performance of the DBAR is that the piezoelectric coupling coefficient has a maximum value determined by the material properties of the piezoelectric layers. For instance, the performance of a DBAR for high frequency applications, which typically use AlN as the piezoelectric material, are limited by a maximum piezoelectric coupling coefficient associated with this material and the parasitic capacitance around the perimeter. The bandwidth of a filter using the DBAR is proportional to this coefficient.

Due to the above and other limitations, it may not be feasible or economical to use conventional DBAR devices for certain applications. For instance, due to limitations on electromechanical coupling coefficient $k_t^2$ and Q factor, the electrical performance may not be attractive enough to justify the cost of using DBARs, especially in low frequency applications, such as 700-900 MHz filters. The area and cost of resonators scales as $1/f^2$, where "f" represents a resonator's center frequency.

The use of aluminum scandium nitride can improve the piezoelectric coupling coefficient of the DBAR, which in turn improves the bandwidth of a filter including the DBAR. Alternatively, scaling down the thickness of the piezoelectric layer will reduce the effective coupling and resonator area while improving the Q of the resonator which results in better insertion loss. This helps to reduce the cost of low frequency applications. These improvements can also be useful, for instance, in Universal Mobile Telecommunications System (UMTS) bands 3 and 8, to produce better insertion loss while maintaining high attenuation at high frequencies. The improved insertion loss and attenuation in these bands may be beneficial, due to reduced battery power required for the transmitter filter and better sensitivity in the receiver section due to lower insertion loss in the receive filter. This often means longer battery life and fewer dropped calls in a wireless device.

Figure 3A:
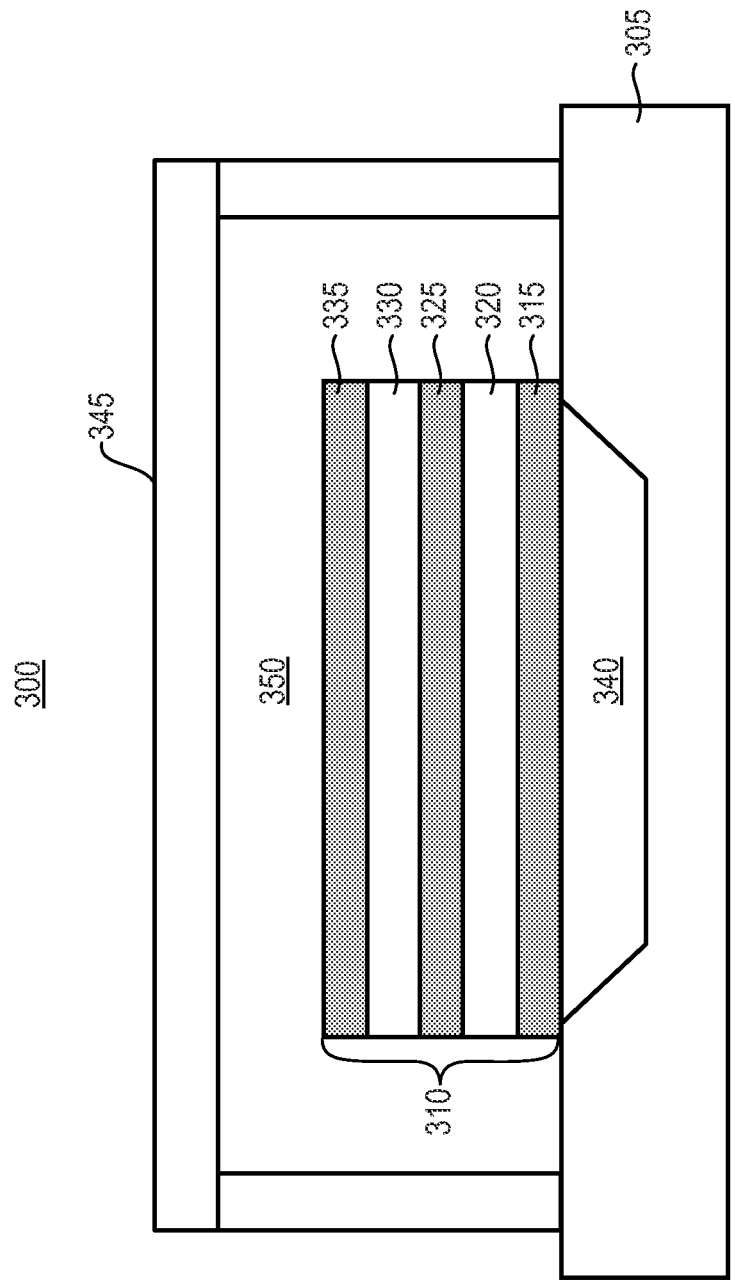
FIG. 3A is a cross-sectional view of an acoustic resonator according to a representative embodiment.
Figure 3B:
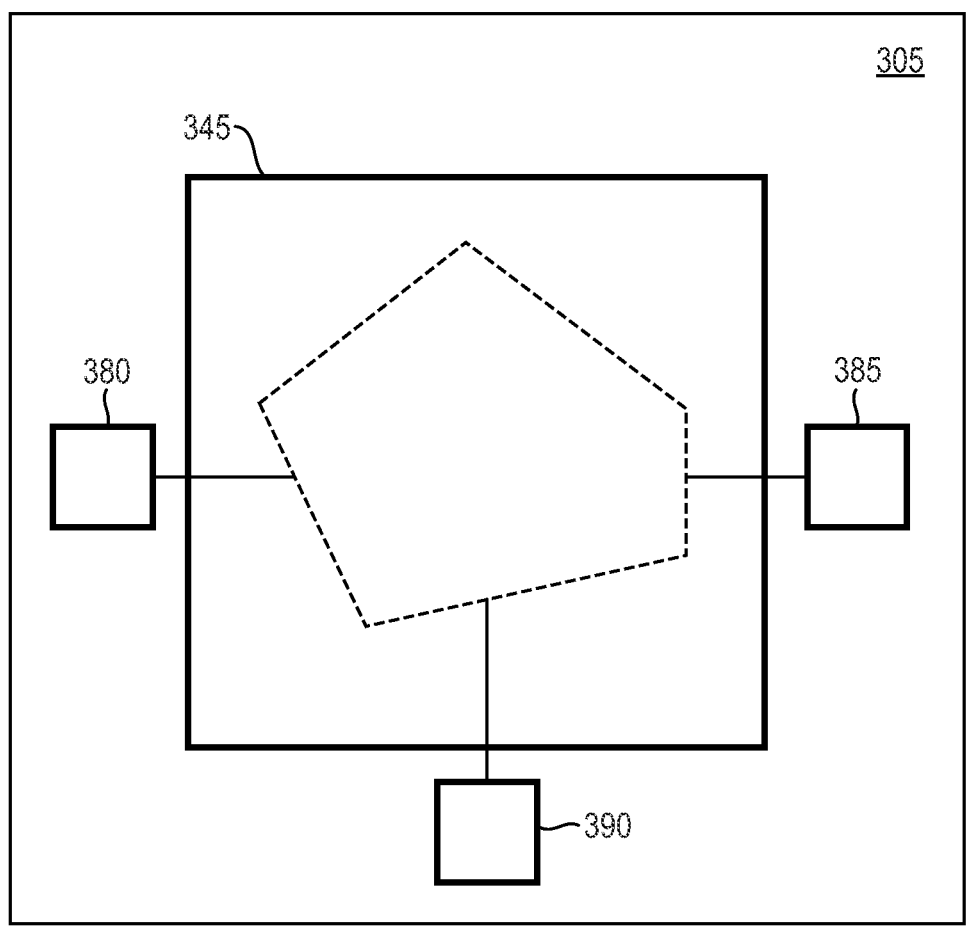
FIG. 3B is a top view of the acoustic resonator of FIG. 3A according to a representative embodiment.

FIG. 3A is a cross-sectional view of an acoustic resonator 300 according to a representative embodiment, and FIG. 3B is a top view of acoustic resonator 300 in accordance with a representative embodiment. In the illustrated embodiments, acoustic resonator 300 comprises a DBAR formed with one or more piezoelectric layers formed of aluminum scandium nitride. As illustrated b FIG. 3B, acoustic resonator 300 comprises an acoustic stack having an apodized pentagonal structure, i.e. an asymmetric pentagon to distribute the spurious mode density over frequency and avoid high dissipation at any one frequency.

Referring to FIG. 3A, acoustic resonator 300 comprises a substrate 305, an acoustic stack 310, and a microcap 345 separated from the acoustic stack 310 by an air-gap 350.

Substrate 305 can be formed of various types of semiconductor materials compatible with semiconductor processes, such as silicon (Si), gallium arsenide (GaAs), indium phosphide (InP), or the like, which can be useful for integrating connections and electronics, thus reducing size and cost. Substrate 305 has an air cavity 340 located below acoustic stack 310 to allow free movement of acoustic stack 310 during operation. Air cavity 340 is typically formed by etching substrate 305 and depositing a sacrificial layer therein prior to formation of acoustic stack 310, and then removing the sacrificial layer subsequent to the formation of acoustic stack 310. As an alternative to air cavity 340, acoustic resonator 300 could include an acoustic reflector such as a Distributed Bragg Reflector (DBR), for example.

Acoustic stack 310 comprises a first electrode 315, a first piezoelectric layer 320 formed on first electrode 315, a second electrode 325 formed on first electrode 315, a second piezoelectric layer 330 formed on second electrode 325, and a third electrode 335 formed on second piezoelectric layer 330.

Electrodes 315, 325, and 335 can be formed of various conductive materials, such as metals compatible with semiconductor processes, including tungsten (W), molybdenum (Mo), aluminum (Al), platinum (Pt), ruthenium (Ru), niobium (Mb), or hafnium (Hf), for example. Electrodes 315, 325, and 335 can also be formed with conductive sub-layers or in combination with other types of layers, such as temperature compensating layers. In addition, electrodes 315, 325, and 335 can be formed of the same material, or they can be formed of different materials.

Third electrode 335 can further comprise a passivation layer (not shown), which can be formed of various types of materials, including AlN, silicon carbide (SiC), BSG, $SiO_2$, SiN, polysilicon, and the like. The thickness of the passivation layer should generally be sufficient to protect the layers of acoustic stack 310 from chemical reactions with the substances that may enter through a leak in the package.

Electrodes 315, 325, and 335 are electrically connected to external circuitry via corresponding contact pads 380, 385, and 390 shown in FIG. 3B. The contact pads are typically formed of a conductive material, such as gold or gold-tin alloy. Although not shown in FIG. 3A, the connections between these electrodes and the corresponding contact pads extend laterally outward from acoustic stack 310. The connections typically pass through or under the sides of microcap 345. The connections are generally formed of a suitable conductive material, such as Ti/W/gold.

One or both of piezoelectric layers 320 and 330 are formed of a thin film piezoelectric Comprising $Al_{1-x}Sc_xN$. In some embodiments, piezoelectric layers 320 and 330 are formed on a seed layer (not shown) disposed over respective upper surfaces of first and second electrodes 315 and 325. The seed layer can be formed of Al, for instance, to foster growth of $Al_{1-x}Sc_xN$. In certain alternative embodiments, one of the piezoelectric layers could be formed of a different piezoelectric Material such as pure AlN, zinc oxide (ZnO), lead zirconium titanate (PZT), gallium nitride (GaN), indium phosphide (InP), or gallium phosphide (GAP), for example. Additionally, one of the piezoelectric layers could be formed by modifying one of the above piezoelectric materials to further include certain types of rare earth metals, such as lanthanum or various lanthanum compounds such as $La_3Ga_5SiO_{14}$, and erbium.

As indicated above, the use of $Al_{1-x}Sc_xN$ in this manner allows acoustic resonator 300 to achieve the benefits typically associated with an DBAR while avoiding or compensating for the corresponding drawbacks, such as decreased piezoelectric coupling coefficient and Q factor, and increased insertion loss. Due to these combined benefits, acoustic resonator 300 may be suitable for applications requiring relatively low cost, such as low frequency filters. For instance, in some embodiments acoustic resonator 300 may be designed with a passband having a center frequency below 1 GHz, between approximately 700 to 900 MHz.

Piezoelectric layers 320 and 330 are typically formed by a sputtering process using one or more scandium-doped aluminum sputtering targets in an atmosphere comprising at least nitrogen gas, typically combination with one or more inert gases such as argon. The sputtering targets are typically doped with a percentage of scandium atoms corresponding to a desired composition of piezoelectric layers 320 and 330. For instance, in some embodiments, a sputtering target may be doped with approximately 5 to 10 percent scandium atoms to produce a piezoelectric layer of where x is between approximately 0.05 and 0.10.

In a DBAR for a ladder filter having a passband at approximately 900 MHz, if piezoelectric layers 320 and 330 both have a thickness of 1.5 microns, a typical resonator area of the DBAR may be about 30,000 square microns. A typical ladder filter would have eight resonators (although this number can vary) and the die area would be about twice this, or 0.5 square millimeters. Without scandium doping, the thicknesses of piezoelectric layers would have to be about 2 microns in order to achieve similar electrical performance, but such an increase in thickness would increase die area and cost by about 33 percent.

In general, there is not a fixed range of thicknesses or frequencies for the piezoelectric layers of a DBAR comprising aluminum scandium nitride because different filters may require different bandwidths and use different thicknesses. Nevertheless, in an example implementation, a 700-900 MHz filter may require piezoelectric layers 320 and 330 to be formed of AlN with thickness of about 1.4 to 3.0 microns to achieve adequate bandwidth. The improved $k_t^2$ provided by the aluminum scandium nitride may allow these layers to be formed approximately 30% thinner, when using about 5-10% scandium, while allowing the DBAR to have substantially the same frequency and electrical signature. Accordingly, a 700-900 MHz filter may allow piezoelectric layers 320 and 330 to be formed of aluminum scandium nitride with a smaller thickness of about 1.0 to 2.1 microns while achieving adequate bandwidth. This reduction in thickness can shrink both the size of a resonator and a corresponding die.

The approximate 30% reduction in the above thicknesses (compared to AlN) may be justified in light of various considerations, such as the following. First, the use of aluminum scandium nitride increases the value of $k_t^2$ for the piezoelectric layers, as indicated above. This allows the DBAR to be designed with a smaller thickness proportional to example data shown in FIG. 5, described below. Second, the aluminum scandium nitride tends to reduce acoustic velocity, which allows a scaling down in thickness of all resonator layers to get back to the same frequency (and concurrent resonator area reduction). Third, the aluminum scandium nitride tends to have a higher dielectric constant, allowing further resonator area reduction for the same total impedance. Fourth, proportionally thicker electrodes tend to provide improved Q-factor, which tends to reduce insertion loss. This can be used for better performance or scaling down the effective $k_t^2$ by thinning the piezoelectric layers even further for additional die shrinking. Notably, the approximate 30% thickness reduction is based on the use of 5-10% scandium, and different improvements can be achieved by using other amounts of scandium.

Microcap 345 is formed over the top of acoustic stack 310 to form an air cavity 350. Air cavity 350 provides acoustic isolation between acoustic stack 310 and surrounding structures, and microcap 345 protects acoustic resonator 310 against damage from environmental factors such as humidity, debris, and so on. In certain embodiments, microcap 345 is formed by etching a cavity in a silicon wafer and then performing a wafer bonding process to connect it to substrate 305. In other embodiments, microcap 345 is formed by attaching an annular gasket to substrate 305 and then covering the gasket with a silicon wafer. As a potential alternative to microcap 345, a molding material such as polyimide, room-temperature vulcanizing rubber (RTV), or glass-loaded epoxy could be used to cover the structures of acoustic resonator 310.

FIG. 3B shows contact pads 380, 385, and 390 connected to respective first, second, and third electrodes 315, 325, and 335 of acoustic stack 310. These contacts pads are located on substrate 305 outside of microcap 345, and they are used to connect acoustic resonator 300 with external circuitry. In a filter such as that illustrated in FIG. 1, signal pads are typically formed in only two of the seven acoustic resonators while multiple ground pads connect to the shunt resonators. In particular, connection pads are formed near the acoustic resonator connected to any external terminal. The other acoustic resonators can be connected to each other by internal connections without the use of contact pads.

During typical operation of acoustic resonator 300, contact pads 380 and 390 are connected to the same voltage so that first and third electrodes 315 and 335 have the same level. Meanwhile, contact pad 385 is connected to a different voltage from contact pads 380 and 390 so that second electrode 325 has a different voltage level from first and third electrodes 315 and 335. In one example, contact pads 380 and 390 are connected to a common reference voltage such as ground, while contact pad 385 is connected to an input signal. Alternatively, contact pad 385 can be connected to ground while contact pads 380 and 390 are both connected to an input signal.

Figure 4:
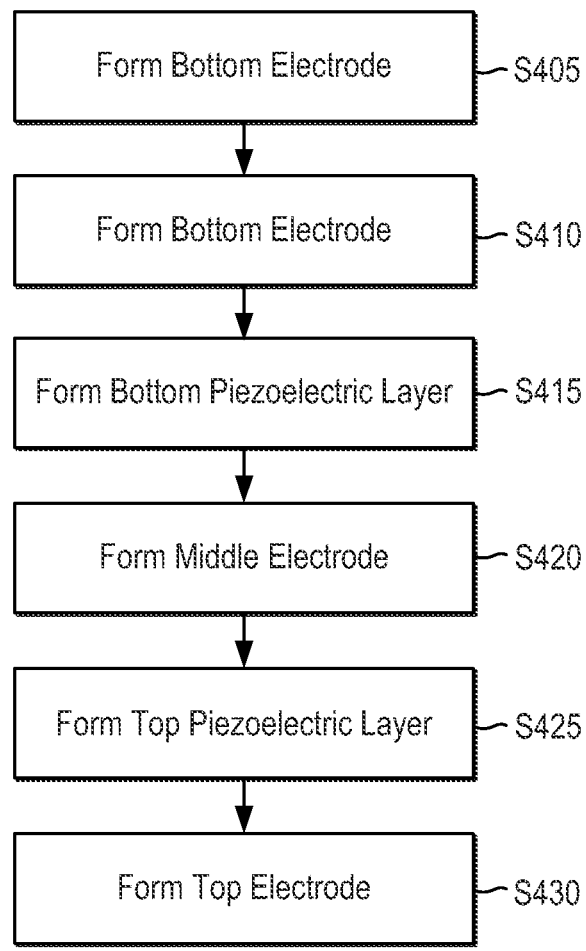
FIG. 4 is a flowchart illustrating a method of manufacturing an acoustic resonator according to a representative embodiment.

FIG. 4 is a flowchart illustrating a method of manufacturing an acoustic resonator according to a representative embodiment. For convenience of explanation, the method of FIG. 4 will be described with reference to acoustic resonator 300 of FIG. 3. However, the method is not limited to forming an acoustic resonator with the illustrated configuration. In the description that follows, example method steps are indicated by parentheses.

Referring to FIG. 4, the method begins by etching substrate 305 to form air cavity 340 (S405). In a typical example, substrate 405 comprises silicon, and air cavity 340 is formed by conventional etching technologies. A sacrificial layer is typically formed in air cavity 340 prior to the formation of acoustic stack 310 and removed subsequent to formation of acoustic stack 310. After the sacrificial layer is formed in air cavity 340, bottom electrode 315 is formed over substrate 305 (S410). Bottom electrode 315 can be formed by a conventional deposition technique using materials such as those indicated above in relation to FIG. 3.

Next, bottom piezoelectric layer 320 is formed on bottom electrode by a sputtering process using a scandium-doped aluminum sputtering target (S415). As indicated in the description of FIG. 3, the sputtering target may comprise, for instance, 5 to 10 percent scandium atoms in order to form bottom piezoelectric layer 320 with a similar proportion of scandium and aluminum atoms. After bottom electrode 315 and piezoelectric layer 320 are formed, middle electrode 325 is formed (S420). In general, middle electrode 325 can be formed of the same or a different material and/or by the same or a different process compared to bottom and top electrodes 315 and 335. Next, top piezoelectric layer 330 is formed over middle electrode 325 (S425). Like bottom piezoelectric layer 320, top piezoelectric layer 330 can also be formed by a sputtering process as described above in relation to FIG. 3. Finally, top electrode 335 is formed on top piezoelectric layer 330 (S430). As will be apparent to those skilled in the art, additional processing steps may be performed subsequent to the formation of top electrode 335, such as the formation of a passivation layer, electrodes, a cap, for example. Moreover, as will also be apparent to those skilled in the art, additional processing steps can be performed between or during the other operations illustrated in FIG. 4.

Figure 5:
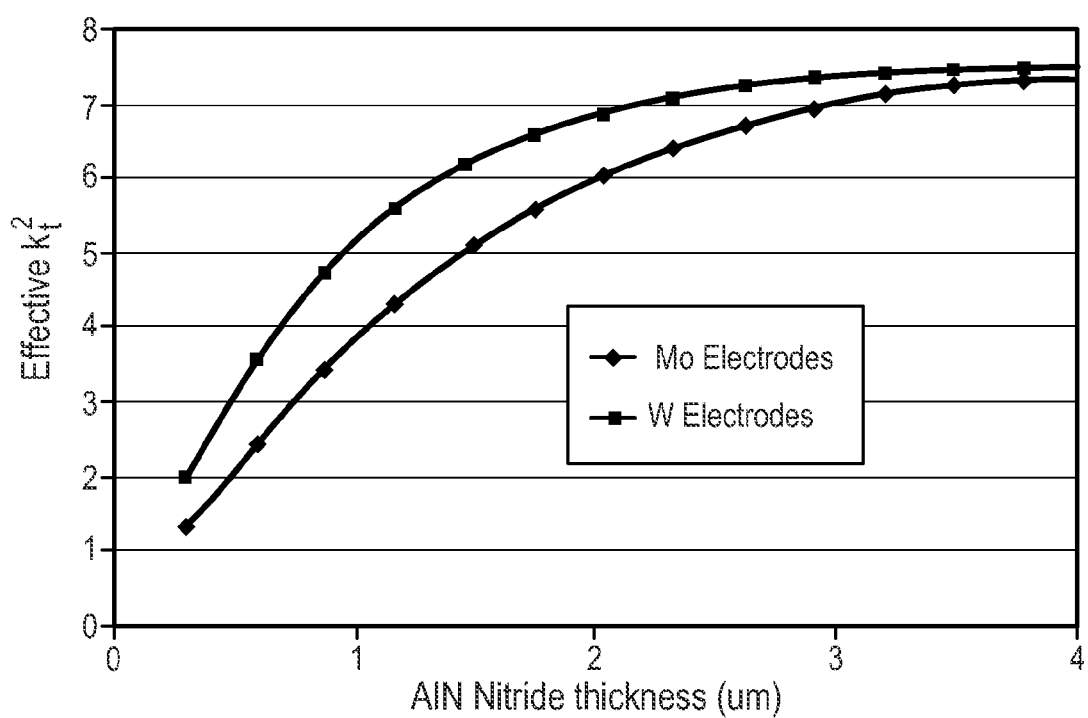
FIG. 5 is a graph illustrating a general relationship between the thickness of an aluminum nitride layer and its electromechanical coupling coefficient $k_t^2$ in an acoustic resonator designed to operate at 850 MHz.

FIG. 5 is a graph illustrating a general relationship between the thickness of an aluminum nitride layer and its effective electromechanical coupling coefficient $k_t^2$ in an acoustic resonator. This effective coupling is the product of the intrinsic material coupling coefficient times a geometrical scale factor depending on the dielectric constants, densities, velocities of sound, and thicknesses of the layers comprising the resonator. The filter bandwidth achievable is proportional to the effective electromechanical coupling coefficient $k_t^2$. Where the aluminum nitride layer further comprises scandium as in the above-described embodiments, the illustrated values of $k_t^2$ will be multiplied by a corresponding improvement value conferred by the scandium. For 5% concentrations of scandium, this improvement value will be about 1-2%. Accordingly, the electromechanical coupling coefficient $k_t^2$ can vary as a function of both the thickness of the aluminum nitride layer as well as any improvement conferred by scandium.

The graph shows values of $k_t^2$ for an acoustic resonator having electrodes made of W and Mo, which have different acoustic impedances. As illustrated by the graph, the use of different electrode materials can also affect the value of $k_t^2$, with W providing a higher value than Mo. Accordingly, W may be used to provide improved $k_t^2$ and/or reduced resonator area in certain applications, such as low-frequency (e.g., 850 MHz) duplexers.

As illustrated in FIG. 5, the electromechanical coupling coefficient $k_t^2$ tends to increase up to a point with the thickness of the aluminum nitride layer. It also tends to increase with the use of scandium. Because $k_t^2$ is increased by both of these factors, a relatively thin $Al_{1-x}Sc_xN$ may achieve substantially the same electrical performance as a thicker AlN layer, but with smaller size, and typically, higher Q factor. Accordingly, the use of $Al_{1-x}Sc_xN$ in a DBAR may allow various cost and performance tradeoffs.

While example embodiments are disclosed herein, those skilled in the art will appreciate that many variations that are in accordance with the present teachings are possible and remain within the scope of the appended claims. For instance, as indicated above, the location, dimensions, and materials of the described acoustic resonator features can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A method of forming a double bulk acoustic resonator (DBAR) structure, comprising:
   providing a substrate;
   forming an air cavity in the substrate;
   forming a first electrode on a substrate and over the air cavity;
   forming a first piezoelectric layer on the first electrode;
   forming a second electrode on the first piezoelectric layer;
   forming a second piezoelectric layer on the second electrode; and
   forming a third electrode on the second piezoelectric layer,
   wherein the first and second piezoelectric layers are formed by a sputter deposition process using at least one sputter target comprising a combination of scandium and aluminum.

2. The method of claim 1, wherein the at least one sputter target comprises scandium-doped aluminum having a scandium concentration between 0 and 50 percent by number of atoms.

3. The method of claim 1, wherein the at least one sputter target comprises scandium-doped aluminum having a scandium concentration of approximately 5 percent by number of atoms to approximately 10 percent by number of atoms.

4. The method of claim 1, wherein the DBAR has a passband with a center frequency between approximately 700 MHz and 900 MHz.

5. The method of claim 4, wherein the first, second, and third electrodes are formed of tungsten.

6. The method of claim 4, wherein the first and second piezoelectric layers each have a thickness in a range of approximately 1.0 μm to approximately 1.5 μm.

7. A double bulk acoustic resonator (DBAR) structure, comprising:
   a first electrode disposed over a substrate;
   an air cavity located in the substrate and below the first electrode;
   a first piezoelectric layer disposed over the first electrode and comprising aluminum scandium nitride;
   a second electrode disposed over the first piezoelectric layer;
   a second piezoelectric layer disposed over the second electrode a id comprising aluminum scandium nitride; and
   a third electrode disposed over the second piezoelectric layer.

8. The DBAR structure of claim 7, wherein the aluminum scandium nitride has a scandium concentration between approximately 0 percent and approximately 50 percent by number of atoms.

9. The DBAR structure of claim 7, wherein the first, second, and third electrodes are formed of tungsten.

10. A ladder filter comprising a plurality of series resonators and a plurality of shunt resonators connected between an input port and an output port, at least one of the series or shunt resonators comprising a double bulk acoustic resonator (DBAR), comprising:
    a first electrode on a substrate;

a first piezoelectric layer on the first electrode and comprising aluminum scandium nitride;

a second electrode on the first piezoelectric layer;

a second piezoelectric layer on the second electrode and comprising aluminum scandium nitride; and a third electrode on the second piezoelectric layer.

11. The ladder filter of claim 10, wherein the ladder filter has a passband with a center frequency in a range of approximately 700 MHz to approximately 900 MHz.

12. The ladder filter of claim 10, wherein the first and second piezoelectric layers each have a thickness in a range of approximately 1.0 to 1.5 microns.

13. The ladder filter of claim 10, wherein the aluminum scandium nitride has a scandium concentration between approximately zero percent by number of atoms and approximately 50 percent by number of atoms.

14. The ladder filter of claim 10, wherein the aluminum scandium nitride has a scandium concentration of approximately 5 percent by number of atoms to approximately 10 percent by number of atoms.

15. The method of claim 1, further comprising, after the forming of the cavity, and before the forming of the first electrode, filling the cavity with sacrificial material, and after forming the third electrode, removing the sacrificial material.

16. A double bulk acoustic resonator (DBAR) structure, comprising:

a first electrode disposed over a substrate;

an air cavity located in the substrate and below the first electrode;

a first piezoelectric layer disposed over the first electrode and comprising aluminum scandium nitride, the first piezoelectric layer having a thickness in a range of approximately 1.0 μm to approximately 1.5 μm;

second electrode disposed over the first piezoelectric layer;

a second piezoelectric layer disposed over the second electrode and comprising aluminum scandium nitride; and a third electrode disposed over the second piezoelectric layer.

17. The DBAR structure of claim 16, wherein the ladder filter has a passband with a center frequency in a range of approximately 700 MHz to approximately 900 MHz.

18. The DBAR structure of claim 16, wherein the second piezoelectric layer has a thickness in a range of approximately 1.0 μm to approximately 1.5 μm.

19. The DBAR structure of claim 16, wherein the aluminum scandium nitride has a scandium concentration between approximately zero percent by number of atoms and 50 percent by number of atoms.

20. The DBAR structure of claim 16, wherein the aluminum scandium nitride has a scandium concentration of approximately 5 percent by number of atoms to approximately 10 percent by number of atoms.

21. A double bulk acoustic resonator (DBAR) structure, comprising:

a first electrode disposed over a substrate;

an air cavity located in the substrate and below the first electrode;

a first piezoelectric layer disposed over the first electrode and comprising aluminum scandium nitride;

second electrode disposed over the first piezoelectric layer;

a second piezoelectric layer disposed over the second electrode and comprising aluminum scandium nitride; and a third electrode disposed over the second piezoelectric layer wherein the DBAR has a passband with a center frequency between approximately 700 MHz and approximately 900 MHz.

22. The DBAR structure of claim 21, wherein the first, second, and third electrodes are formed of tungsten.

23. The DBAR structure of claim 21, wherein the first and second piezoelectric layers each have a thickness in a range of approximately 1.0 μm to approximately 1.5 μm.

* * * * *